(12) United States Patent
Lin et al.

(10) Patent No.: US 9,653,530 B2
(45) Date of Patent: May 16, 2017

(54) ORGANIC LIGHT-EMITTING DIODE MODULE EQUIPPED WITH VERTICAL ELECTRIC CONNECTION STRUCTURE

(71) Applicant: WiseChip Semiconductor Inc., Miaoli County (TW)

(72) Inventors: Po-Hsin Lin, Miaoli County (TW); Shih-Hung Chang, Miaoli County (TW); Shang-Chih Lin, Miaoli County (TW); Chia-Chi Huang, Miaoli County (TW); I-Hsuan Lin, Miaoli County (TW); Sheng-Hsu Shih, Miaoli County (TW); Chien-Hsun Chen, Miaoli County (TW); Yung-Cheng Tsai, Miaoli County (TW); Chien-Le Li, Miaoli County (TW)

(73) Assignee: WiseChip Semiconductor Inc., Miaoli County (TW)

( * ) Notice: Subject to any disclaimer, the term of this patent is extended or adjusted under 35 U.S.C. 154(b) by 0 days.

(21) Appl. No.: 15/014,956

(22) Filed: Feb. 3, 2016

(65) Prior Publication Data
US 2016/0260793 A1 Sep. 8, 2016

(30) Foreign Application Priority Data
Mar. 5, 2015 (TW) .............................. 104106978 A

(51) Int. Cl.
*H01L 27/32* (2006.01)

(52) U.S. Cl.
CPC ...... *H01L 27/3297* (2013.01); *H01L 27/3202* (2013.01); *H01L 27/3204* (2013.01); *H01L 27/3276* (2013.01)

(58) Field of Classification Search
None
See application file for complete search history.

(56) References Cited

U.S. PATENT DOCUMENTS

2008/0165243 A1* 7/2008 Oh ..................... H01L 51/5203
347/238

FOREIGN PATENT DOCUMENTS

TW          I441554          6/2014

* cited by examiner

*Primary Examiner* — Joseph Schoenholtz
(74) *Attorney, Agent, or Firm* — Amin, Turocy & Watson, LLP

(57) ABSTRACT

An OLED module equipped with vertical electric connection structure includes a substrate, a plurality of OLED clusters, an anode wire structure and a cathode wire structure. The substrate is extended toward a first direction. The OLED clusters are located on the substrate in the first direction. The anode wire structure includes a bottom layer wire set, an insulation layer, a middle wire layer set and a top layer wire set. The bottom layer wire set is located on the substrate. The insulation layer is located on the bottom layer wire set. The top layer wire set is located on the insulation layer. The cathode wire structure is located on the substrate and extended axially thereof. The middle layer wire set runs through the insulation layer and forms vertical connection between the bottom layer wire set and the top layer wire set.

9 Claims, 6 Drawing Sheets

ORGANIC LIGHT-EMITTING DIODE MODULE EQUIPPED WITH VERTICAL ELECTRIC CONNECTION STRUCTURE

FIELD OF THE INVENTION

The present invention relates to an organic light-emitting diode (OLED in short hereinafter) module and particularly to an OLED module equipped with vertical electric connection structure.

BACKGROUND OF THE INVENTION

OLED is a light emitting element which basically includes an anode, a cathode, an Electron Hole (hole in short hereinafter) transmission layer located between the anode and the cathode, an electron transmission layer, and an organic light-emitting layer located between the hole transmission layer and the electron transmission layer. When a voltage is applied to the anode and the cathode, the hole and the electron are injected respectively from the anode and the cathode to the hole transmission layer and the electron transmission layer to join in the organic light-emitting layer and release an energy in a light form.

Compared with the conventional light-emitting elements the OLED has many advantages, such as lower electric consumption, flexible, faster reaction speed and the like, hence it is widely used in lighting fixtures, electronic indication lights and display backlight source and the like, and has gradually replaced traditional light-emitting elements such as LED, cold cathode tube or tungsten light bulb.

Conventional OLED structure, such as Taiwan Patent NO.I441554 entitled "OLED device with high color rendering" includes a substrate, a first conductive layer, a plurality of white light light-emitting layers and a second conductive layer. The first conductive layer is located on the substrate. The white light light-emitting layers are located on the first conductive layer, and the second conductive layer is located on the white light light-emitting layers. The white light light-emitting layers are complementary in spectrum, and at least one carrier regulation layer can be selectively placed between the white light light-emitting layers to further improve light-emitting efficiency and color rendering.

U.S. patent publication No. 2008/0165243 also discloses an OLED which includes a substrate, a plurality of OLED sets located on the substrate, a plurality of first wires located on the substrate, a plurality of spacers to separate the OLED sets, a plurality of first conductive blocks located on the substrate and a plurality of second conductive blocks located on the substrate. The OLED includes a first electrode, an organic light-emitting layer and a second electrode. The first wires are connected to the first electrodes of abutting OLED sets, the first conductive blocks are connected respectively to the first electrode of a first cluster, and the second conductive blocks are connected respectively to the second electrode of various clusters. The OLED module formed via the aforesaid technique requires a great deal of area for electrode wiring that results in too large size of elements.

SUMMARY OF THE INVENTION

The primary object of the present invention is to solve the problem of the conventional OLED of taking too large area on electrode wiring that makes reducing element size impossible.

To achieve the foregoing object the present invention provides an OLED module equipped with vertical electric connection structure that includes a substrate, a plurality of OLED clusters, an anode wire structure and a cathode wire structure. The substrate is extended toward a first direction and has a first side and a second side separated in the first direction. The OLED clusters are located on the substrate in the first direction and include respectively a first OLED and a second OLED that oppose each other, and a third OLED and a fourth OLED that are located between the first OLED and the second OLED.

The anode wire structure includes a bottom layer wire set, an insulation layer, a middle layer wire set and a top layer wire set. The bottom layer wire set is located on the substrate and includes a first bottom layer wire extended toward the first side, a second bottom layer wire, a third bottom layer wire, a fourth bottom layer wire and a bottom layer external connection wire extended in the first direction. The first bottom layer wire, the second bottom layer wire, the third bottom layer wire and the fourth bottom layer wire include respectively one end formed electric connection with the first OLED, the second OLED, the third OLED and the fourth OLED. The bottom layer external connection wire is electrically connected between another ends of the third bottom layer wire and the four bottom layer wire. The third bottom layer wire and the fourth bottom layer wire have an extended length smaller than or equal to the first bottom layer wire and the second bottom layer wire. The insulation layer is located on the bottom layer wire set and has a first through hole and a second through hole corresponding respectively to another ends of the first bottom layer wire and the second bottom layer wire. The middle layer wire set includes a first middle layer wire located in the first through hole to form electric connection with another end of the first bottom layer wire and a second middle layer wire located in the second through hole to form electric connection with another end of the second bottom layer wire. The top layer wire set is located on the insulation layer and includes a top layer internal connection wire which is connected between the first middle layer wire and the second middle layer wire. The cathode wire structure is located on the substrate and extended toward the first direction to form electric connection with the first OLED, the second OLED, the third OLED and the fourth OLED.

Thus, with the bottom layer wire set passing through the insulation layer via the middle layer wire set to form vertical connection with the top layer wire set part of wire area parallel with the substrate is replaced by a vertical connection structure, therefore can shrink the area of the OLED module.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1A:
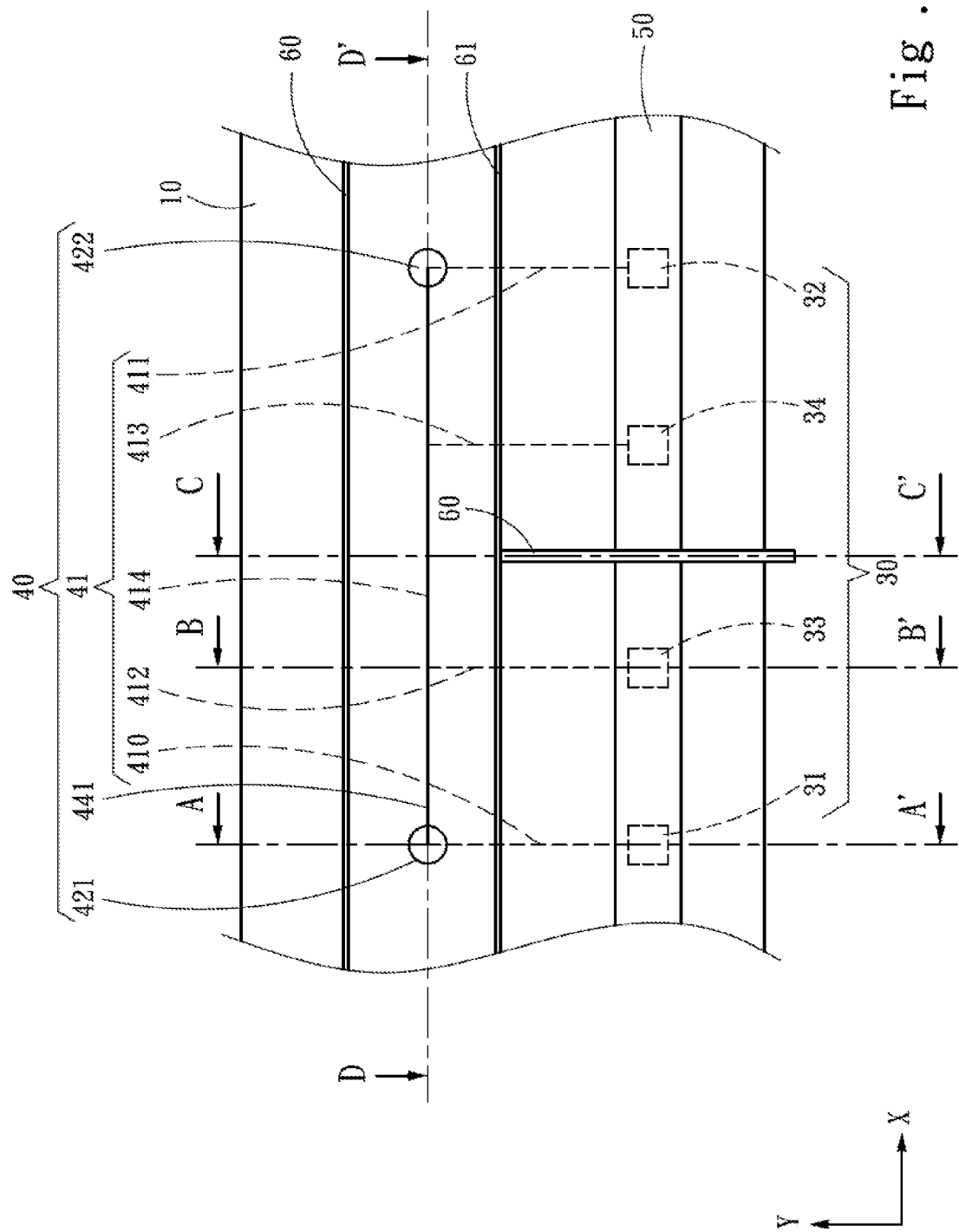
FIG. 1A is a top view of an embodiment of the invention.

Please refer to FIGS. 1A through 1E for a top view and various sectional views of an embodiment of the OLED module equipped with vertical electric connection structure of the invention. The OLED module includes a substrate 10, a plurality of OLED clusters 30, an anode wire structure 40, a cathode wire structure 50 and barrier layer 60. The substrate 10 is extended toward a first direction X and has a first side and a second side separated in the first direction. In this embodiment the first side means an upper edge of the substrate 10 in FIG. 1A, and the second side means a lower edge of the substrate 10 in FIG. 1A. The OLED clusters 30 are located on the substrate 10 in the first direction X and include respectively a first OLED 31 and a second OLED 32 that oppose each other, and a third OLED 33 and a fourth OLED 34 that are located between the first OLED 31 and the second OLED 32.

Figure 1B:
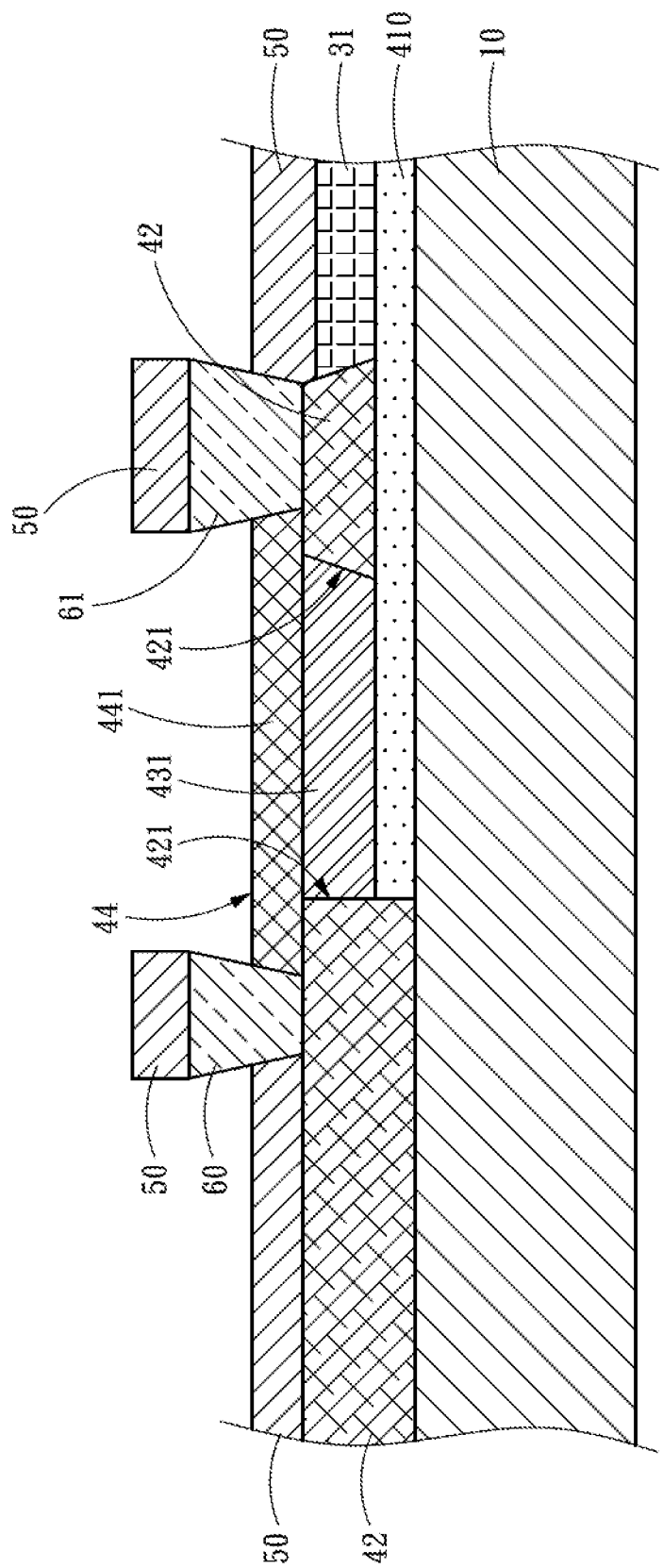
FIG. 1B is a sectional view taken on line A-A' in FIG. 1A.

Please referring to FIG. 1B, the anode wire structure 40 includes a bottom layer wire set 41, an insulation layer 42, a middle layer wire set 43 and a top layer internal connection wire 441. The bottom layer wire set 41 includes a first bottom layer wire 410 extended toward the first side, a second bottom layer wire 411, a third bottom layer wire 412, a fourth bottom layer wire 413 and a bottom layer external connection wire 414 extended in the first direction X. The first bottom layer wire 410, the second bottom layer wire 411, the third bottom layer wire 412 and the fourth bottom layer wire 413 are extended parallel with a second direction Y perpendicular to the first direction X, and also include respectively one end formed electric connection with the first OLED 31, the second OLED 32, the third OLED 33 and the fourth OLED 34.

In this invention the third bottom layer wire 412 and the fourth bottom layer wire 413 are spaced from the first side at an extended length smaller than or equal to the first bottom layer wire 410 and the second bottom layer wire 411. Here, the first direction X means a horizontal axial direction in the middle of the substrate 10. In this embodiment the third bottom layer wire 412 and the fourth bottom layer wire 413 are spaced from the first side at an extended length equal to the first bottom layer wire 410 and the second bottom layer wire 411. The insulation layer 42 is located on the bottom layer wire set 41. Furthermore, referring to FIG. 1B, the insulation layer 42 is located on the first bottom layer wire 410 of the bottom layer wire set 41. Also referring to FIG. 1C, the insulation layer 42 is located on the third bottom layer wire 412, and referring to FIG. 1D, the insulation layer 42 is located on the bottom layer external connection wire 414. The insulation layer 42 has a first through hole 421 and a second through hole 422 that correspond respectively to another end of the first bottom layer wire 410 and another end of the second bottom layer wire 411. Also referring to FIGS. 1B through 1D, the barrier layer 60 is located on the insulation layer 42.

Figure 1C:
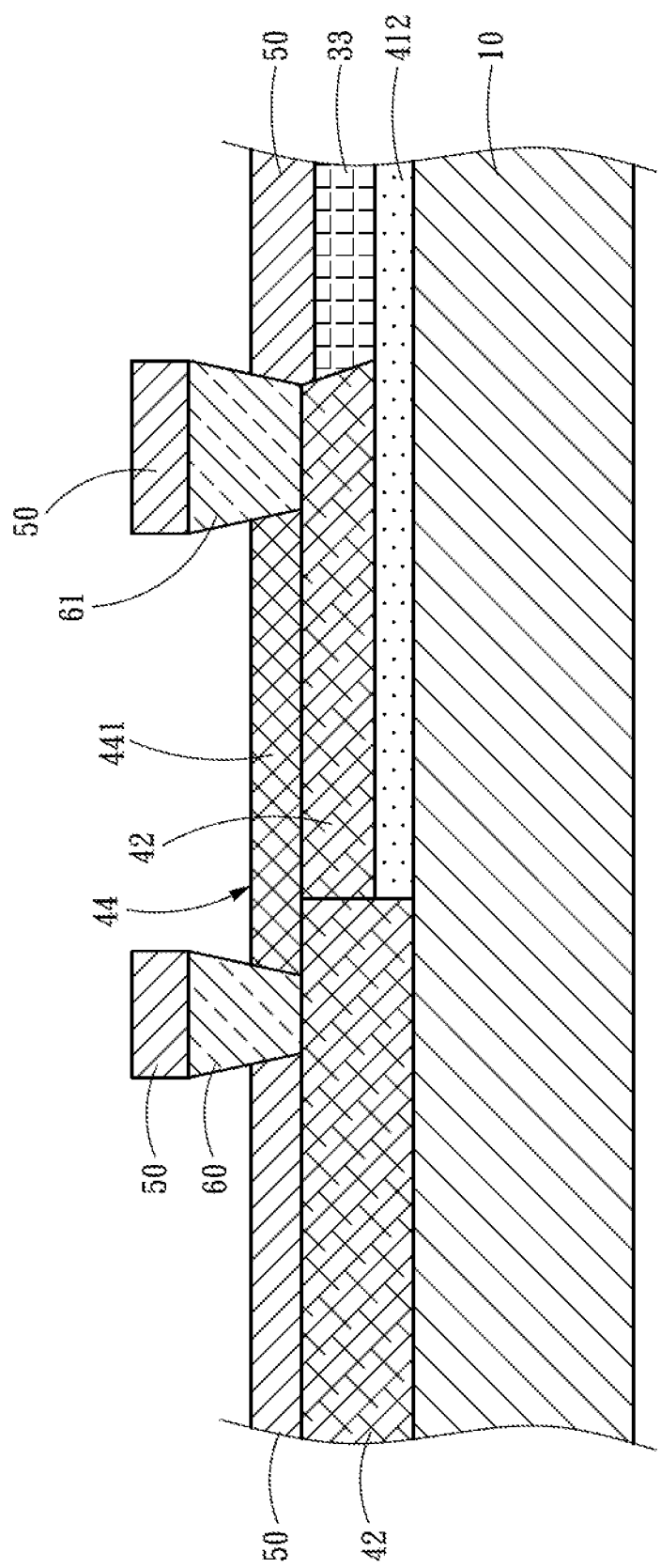
FIG. 1C is a sectional view taken on line B-B' in FIG. 1A.
Figure 1D:
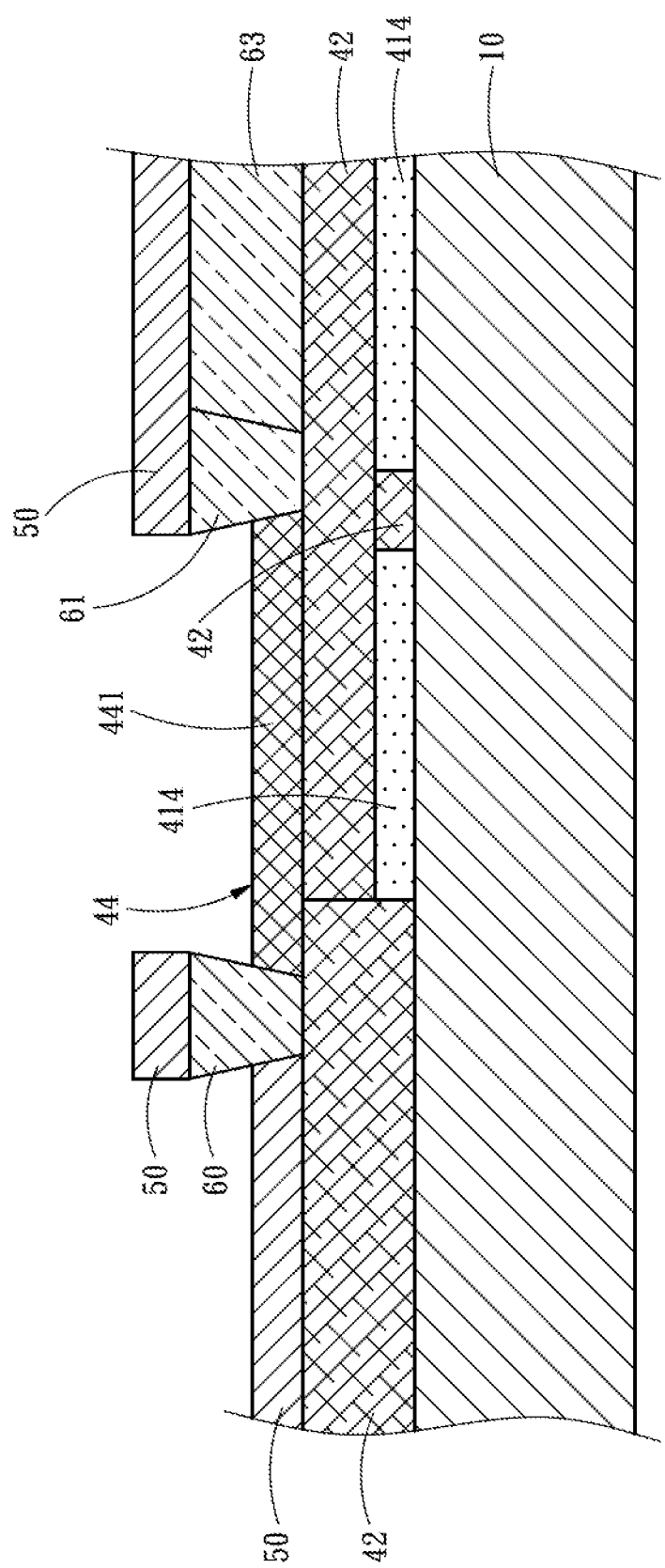
FIG. 1D is a sectional view taken on line C-C' in FIG. 1A.

Please referring to FIG. 1C, the third OLED 33 is connected to the third bottom layer wire 412 which is separated from the top layer internal connection wire 441 through the insulation layer 42 at different planes. Also referring to FIG. 1D, the bottom layer external connection wire 414 is separated from the top layer internal connection wire 441 through the insulation layer 42 at different planes. The bottom layer external connection wire 414 forms electrical connection with another ends of the third bottom layer wire 412 and the fourth bottom layer wire 413. Please further referring to FIG. 1E, the bottom layer external connection wire 414 has two ends formed electric connection with another ends of the third bottom layer wire 412 and the fourth bottom layer wire 413 as shown in FIG. 1C.

Figure 1E:
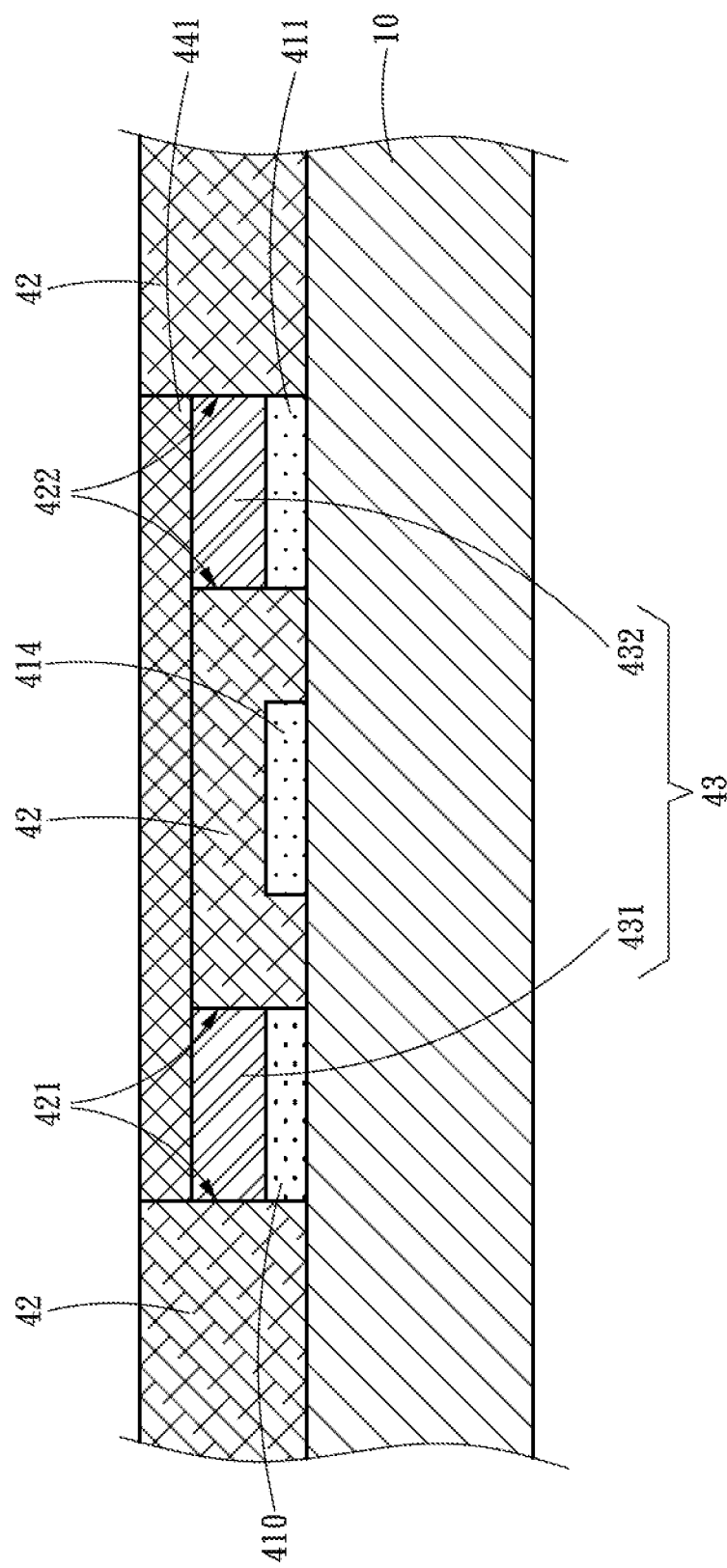
FIG. 1E is a sectional view taken on line D-D' in FIG. 1A.

Please referring to FIG. 1E, the middle layer wire set 43 includes a first middle layer wire 431 and a second middle layer wire 432 that are located respectively in the first through hole 421 and the second through hole 422, and form electrical connection with another ends of the first bottom layer wire 410 and the second bottom layer wire 411. Thus, the first bottom layer wire 410 and the second bottom layer wire 411 are perpendicular respectively to the first middle layer wire 431 and the second middle layer wire 432 for connection therewith, and extended in a vertical axial direction. The top layer internal connection wire 441 is connected between the first middle layer wire 431 and the second middle layer wire 432. More specifically, the first middle layer wire 431 is extended in the vertical axial direction from another end of the first bottom layer wire 410 to one end of the top layer internal connection wire 441, and the second middle layer wire 432 is extended in the vertical axial direction from another end of the second bottom layer wire 411 to another end of the top layer internal connection wire 441, the vertical axial direction is perpendicular to the substrate 10.

By means of the structure set forth above, with the first bottom layer wire 410 and the second bottom layer wire 411 vertically connected respectively to two ends of the top layer internal connection wire 441 via the first middle layer wire 431 and the first through hole 421, and the second middle layer wire 431 and the second through hole 422, the bottom layer wire set 41, the middle layer wire set 43 and the top layer internal connection wire 441 can be located at different planes to replace part of wire area parallel with the substrate 10 by a vertical connection structure, therefore can shrink the area of the anode wire structure 40 parallel with the substrate 10.

The cathode wire structure 50 is located on the substrate 10 and extended in the first direction X to form electric connection with the first OLED 31, the second OLED 32, the third OLED 33 and the fourth OLED 34. In this embodiment the cathode wire structure 50 is located on the first OLED 31, the second OLED 32, the third OLED 33 and the fourth OLED 34, and the barrier layer 60 includes a first barrier portion 61 located between the top layer internal connection wire 441 and the cathode wire structure 50.

Figure 2:
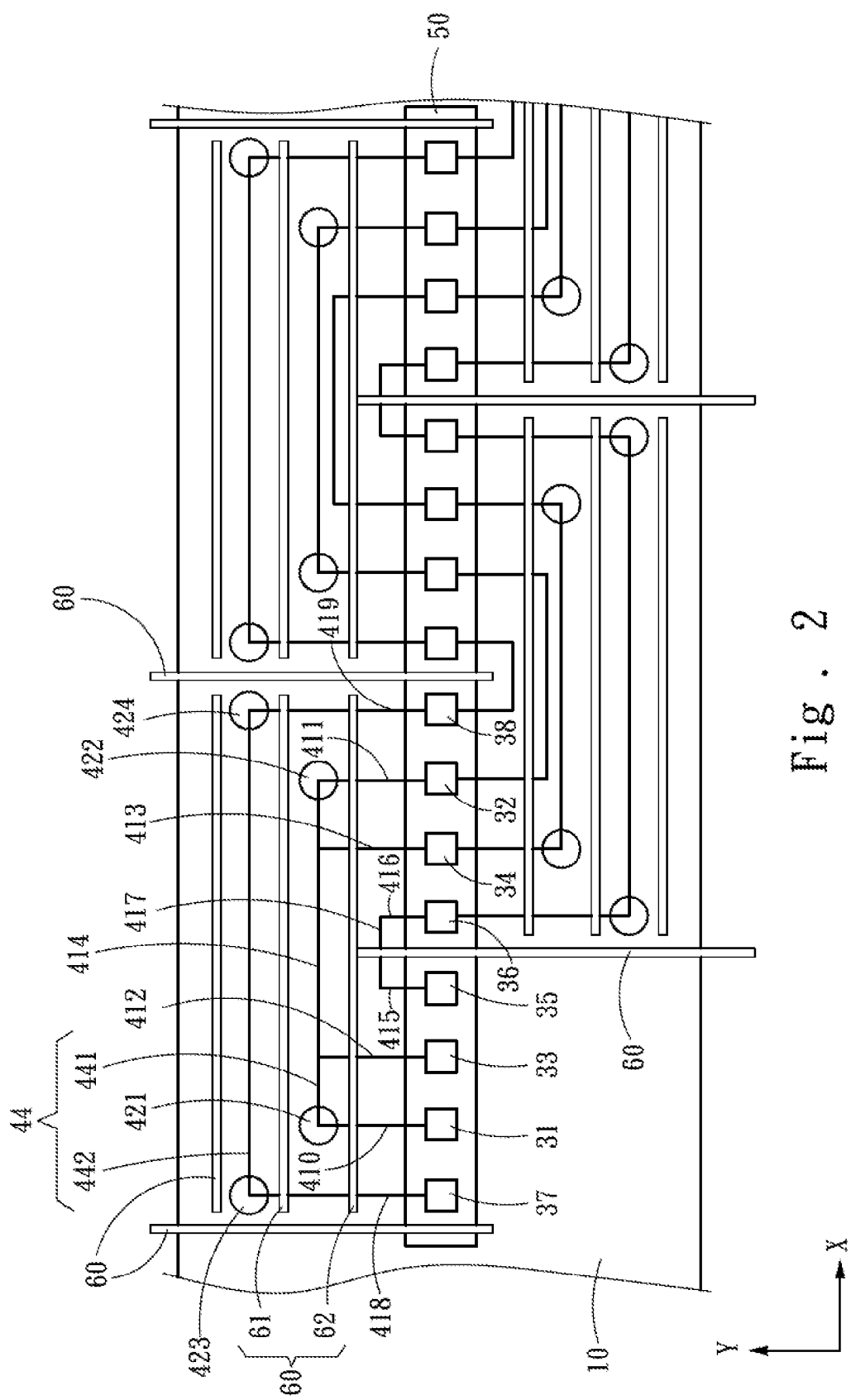
FIG. 2 is a top view of another embodiment of the invention.

Please refer to FIG. 2 for another embodiment of the invention. Please be noted that the elements at the lower layer are marked by solid lines rather than the dashed lines shown in FIG. 1A. In this embodiment the OLED module is designed as a line light source, preferably a light source used on a laser printer. The OLED clusters 30 further can include a fifth OLED 35, a sixth OLED 36, a seventh OLED 37 and an eighth OLED 38. The fifth OLED 35 and the sixth OLED 36 are located between the third OLED 33 and the fourth OLED 34, and the bottom layer wire set 41 further includes a fifth bottom layer wire 415, a sixth bottom layer wire 416 and a bottom layer internal connection wire 417. The fifth bottom layer wire 415 and the sixth bottom layer wire 416 form electric connection respectively with one end of the fifth OLED 35 and the sixth OLED 36, and the bottom layer internal connection wire 417 forms electric connection with another ends of the fifth bottom layer wire 415 and the sixth bottom layer wire 416, and the fifth bottom layer wire 415 and the sixth bottom layer wire 416 include respectively an extended length opposing the first direction X smaller than the third bottom layer wire 412 and the fourth bottom layer wire 413 opposing the first direction X.

The seventh OLED 37 and the eighth OLED 38 are located respectively at one side of the first OLED 31 remote from the third OLED 33, and one side of the second OLED 32 remote from the fourth OLED 34. The bottom layer wire set 41 further includes a seventh bottom layer wire 418 and an eighth bottom layer wire 419 that include respectively an extended length opposing the first direction X greater than the first bottom layer wire 410 and the second bottom layer wire 411 opposing the first direction X. The seventh bottom layer wire 418 and the eighth bottom layer wire 419 include respectively one end to form electric connection with the seventh OLED 37 and the eighth OLED 37. The insulation layer 42 further includes a third through hole 423 and a fourth through hole 424 corresponding respectively to another ends of the seventh bottom layer wire 418 and the eighth bottom layer wire 419. The middle layer wire set 43 further includes a third middle later wire (not shown in the drawings, but similar to the first middle layer wire 431 located in the first through hole 421 or the second middle layer wire 432 located in the second through hole 422 as shown in FIG. 1E) located in the third through hole 423 to form electric connection with another end of the seventh bottom layer wire 418, and a fourth middle layer wire (also not shown in the drawings, but similar to the first middle layer wire 431 located in the first through hole 421 or the second middle layer wire 432 located in the second through hole 422 as shown in FIG. 1E) located in the fourth through hole 424 to form electric connection with another end of the eighth bottom layer wire 419.

In addition, the invention further includes a top layer wire set 44 which has the top layer internal connection wire 441 and a top layer external connection wire 442. The top layer external connection wire 442 is connected between the third middle layer wire and the fourth middle layer wire.

As shown in the drawings, the OLED clusters 30 include eight OLEDs in a unit, and a plurality of units can be arranged on a straight line to form a linear light source. But this is merely an example without limiting the number of the OLEDs in each unit. Moreover, the barrier layer 60 is formed between the units. The bottom layer wires in the bottom layer wire set 41 and the top layer wires in the top layer wire set 44 also are interposed by the barrier layer 60. For instance, the barrier layer 60 can include the first barrier portion 61 located between the top layer external connection wire 442 and the top layer internal connection wire 441, and also a second barrier portion 62 located between the bottom layer internal connection wire 417 and the bottom layer external connection wire 414. In addition, drive method of the OLED clusters 30 is a technique known in the art, details are omitted herein.

As a conclusion, the bottom layer wires of part of the bottom layer wire set can be extended vertically and axially via the through holes and the middle layer wire set to connect to the top layer wire set so that part of the wire area parallel with the substrate can be replaced by the vertical connection structure, thereby shrink the area of the OLED module.

What is claimed is:

1. An organic light-emitting diode module equipped with vertical electric connection structure, comprising:
   a substrate which is extended toward a first direction and includes a first side and a second side separated in the first direction;
   a plurality of organic light-emitting diode (OLED) clusters located on the substrate in the first direction that include a first OLED and a second OLED opposing each other, and a third OLED and a fourth OLED that are located between the first OLED and the second OLED;
   an anode wire structure including:
      a bottom layer wire set which is located on the substrate and includes a first bottom layer wire extended toward the first side, a second bottom layer wire, a third bottom layer wire, a fourth bottom layer wire and a bottom layer external connection wire extended in the first direction, the first bottom layer wire, the second bottom layer wire, the third bottom layer wire and the fourth bottom layer wire including respectively one end formed electric connection with the first OLED, the second OLED, the third OLED and the fourth OLED, the bottom layer external connection wire forming electric connection between another end of the third bottom layer wire and the fourth bottom layer wire, wherein the third bottom layer wire and the fourth bottom layer wire include respectively an extended length smaller than or equal to the first bottom layer wire and the second bottom layer wire;
      an insulation layer which is located on the bottom layer wire set and includes a first through hole and a second through hole that correspond to another end of the first bottom layer wire and another end of the second bottom layer wire;
      a middle layer wire set including a first middle layer wire located in the first through hole to form electric connection with the another end of the first bottom layer wire and a second middle layer wire located in the second through hole to form electric connection with the another end of the second bottom layer wire; and
      a top layer wire set which is located on the insulation layer and includes a top layer internal connection wire to connect between the first middle layer wire and the second middle layer wire; and
   a cathode wire structure which is located on the substrate and extended in the first direction to form electric connection with the first OLED, the second OLED, the third OLED and the fourth OLED.

2. The organic light-emitting diode module equipped with vertical electric connection structure of claim 1, wherein the OLED clusters further include a fifth OLED and a sixth OLED that are located between the third OLED and the fourth OLED, and the bottom layer wire set further includes a fifth bottom layer wire, a sixth bottom layer wire and a bottom layer internal connection wire, the fifth bottom layer wire and the sixth bottom layer wire including respectively one end to form electric connection with the fifth OLED and the sixth OLED, the bottom layer internal connection wire forming electric connection with another ends of the fifth bottom layer wire and the sixth bottom layer wire.

3. The organic light-emitting diode module equipped with vertical electric connection structure of claim 2, wherein the fifth bottom layer wire and the sixth bottom layer wire include respectively an extended length opposing the first direction and smaller than the third bottom layer wire and the fourth bottom layer wire.

4. The organic light-emitting diode module equipped with vertical electric connection structure of claim 2, wherein the OLED clusters further include a seventh OLED at one side of the first OLED remote from the third OLED and an eighth OLED at one side of the second OLED remote from the fourth OLED, and the bottom layer wire set further includes a seventh bottom layer wire and an eighth bottom layer wire that include respectively one end to form electric connection with the seventh OLED and the eighth OLED, the insulation layer further including a third through hole and a fourth trough hole that correspond respectively to another ends of the seventh bottom layer wire and the eighth bottom layer wire, the middle layer wire set further including a third middle layer wire located in the third through hole to form electric connection with the another end of the seventh bottom layer wire and a fourth middle layer wire located in the fourth through hole to form electric connection with the another end of the eighth bottom layer wire, the top layer wire set further including a top layer external connection wire to connect between the third middle layer wire and the fourth middle layer wire.

5. The organic light-emitting diode module equipped with vertical electric connection structure of claim 4, wherein the seventh bottom layer wire and the eighth bottom layer wire include respectively an extended length opposing the first direction and greater than the first bottom layer wire and the second bottom layer wire.

6. The organic light-emitting diode module equipped with vertical electric connection structure of claim 4 further including a barrier layer located on the insulation layer, the barrier layer including a first barrier portion located between the top layer internal connection wire and the top layer external connection wire.

7. The organic light-emitting diode module equipped with vertical electric connection structure of claim 6, wherein the barrier layer further includes a second barrier portion located between the bottom layer internal connection wire and the bottom layer external connection wire.

8. The organic light-emitting diode module equipped with vertical electric connection structure of claim 1, wherein the first bottom layer wire, the second bottom layer wire, the third bottom layer wire and the fourth bottom layer wire are extended in parallel with a second direction perpendicular to the first direction.

9. The organic light-emitting diode module equipped with vertical electric connection structure of claim 1, wherein the first middle layer wire is vertically and axially extended from another end of the first bottom layer wire to one end of the top layer external connection wire, and the second middle layer wire is vertically and axially extended from another end of the second bottom layer wire to another end of the top layer external connection wire, the vertical and axial direction being perpendicular to the substrate.

* * * * *